United States Patent [19]

Masuoka

[11] Patent Number: 4,466,081
[45] Date of Patent: Aug. 14, 1984

[54] SEMICONDUCTOR MEMORY DEVICE

[75] Inventor: Fujio Masuoka, Yokohama, Japan

[73] Assignee: Tokyo Shibaura Denki Kabushiki Kaisha, Kawasaki, Japan

[21] Appl. No.: 320,935

[22] Filed: Nov. 13, 1981

[30] Foreign Application Priority Data

Dec. 8, 1980 [JP] Japan ................................ 55/172914
Dec. 8, 1980 [JP] Japan ................................ 55/172918
Dec. 20, 1980 [JP] Japan ................................ 55/180950

[51] Int. Cl.³ .......................................... G11C 11/40
[52] U.S. Cl. ...................................... 365/218; 371/21
[58] Field of Search ..................... 365/218; 371/10, 21

[56] References Cited

U.S. PATENT DOCUMENTS

| 4,099,196 | 4/1978 | Simko .................................... 357/23 |
| 4,203,153 | 5/1980 | Frohman-Bentchkowsky et al. ........................................ 365/185 |
| 4,357,685 | 11/1982 | Daniele et al. ...................... 365/189 |
| 4,375,087 | 2/1983 | Wanlass ............................... 365/218 |

OTHER PUBLICATIONS

1980 IEEE International Solid-State Circuit Conference 152 (Feb. 1980) A 16Kb Electrically Erasable Nonvolatile Memory.

Primary Examiner—Terrell W. Fears
Attorney, Agent, or Firm—Finnegan, Henderson, Farabow, Garrett & Dunner

[57] ABSTRACT

A semiconductor memory device is constituted by a MOS transistor having a floating gate for storing data. An erase gate, a portion of which is under a part of the floating gate, is arranged on the MOS transistor to discharge electrons from the floating gate. The MOS transistors are arranged in a matrix form in which the erase gates of all the MOS transistors are commonly connected and a data erase voltage is applied to the erase gates to erase the data.

15 Claims, 42 Drawing Figures

F I G. 9
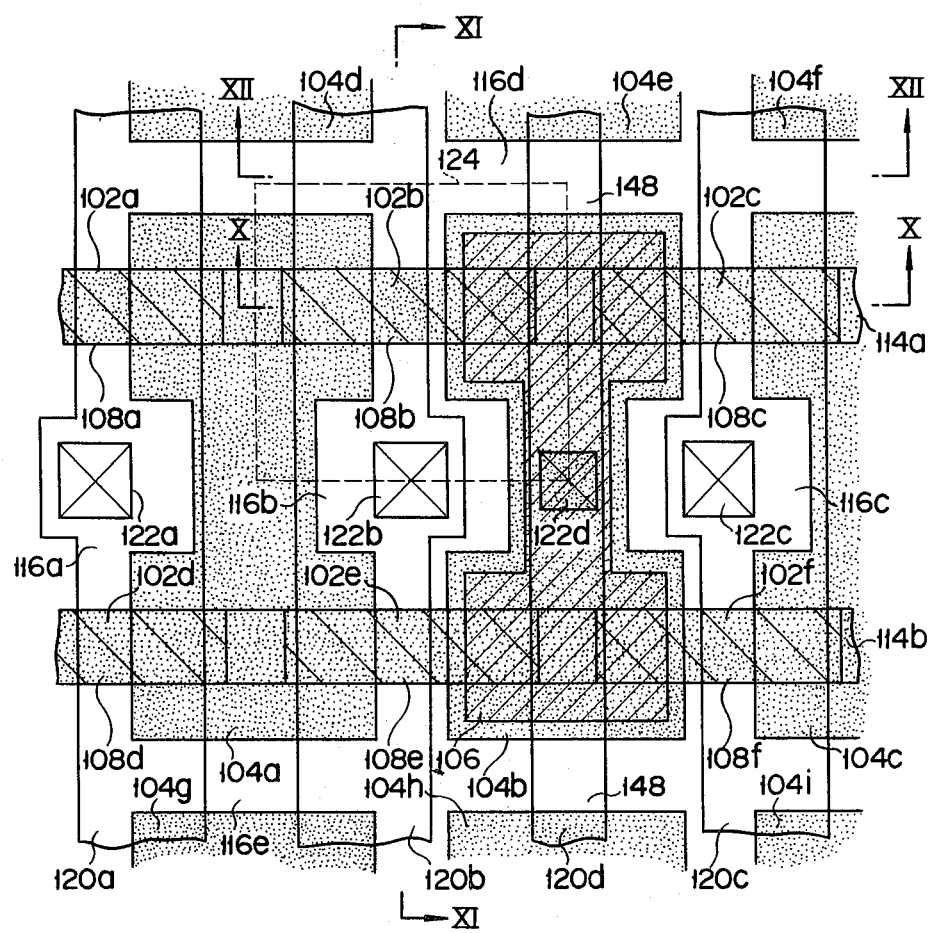

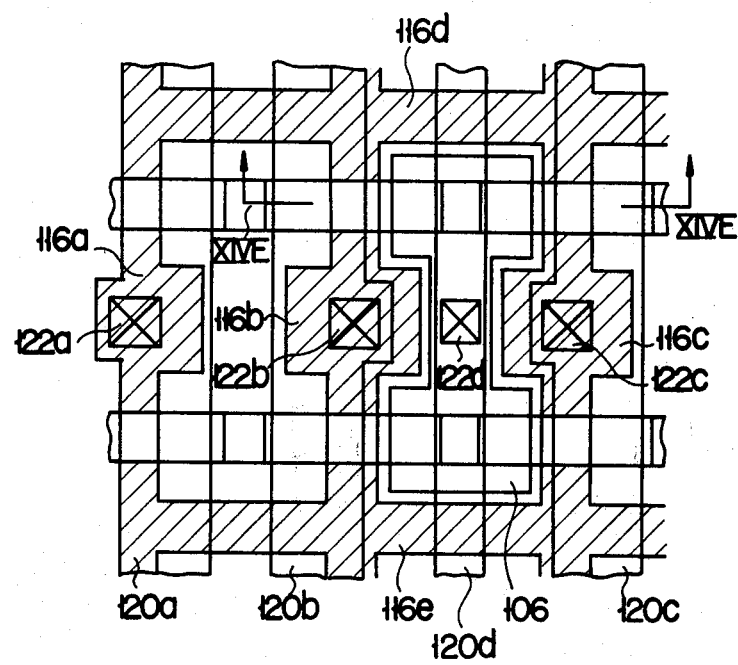
F I G. 13E

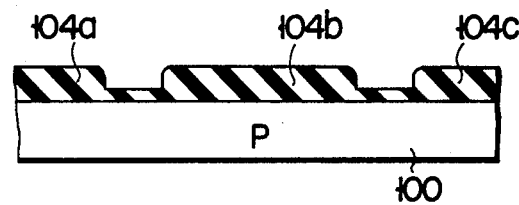
F I G. 14A
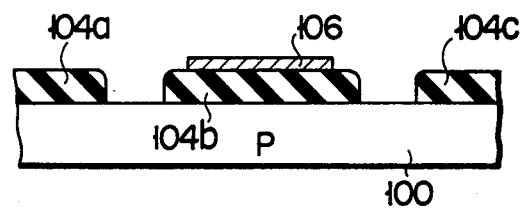
F I G. 14B
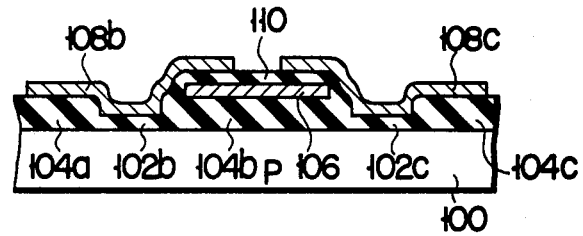
F I G. 14C
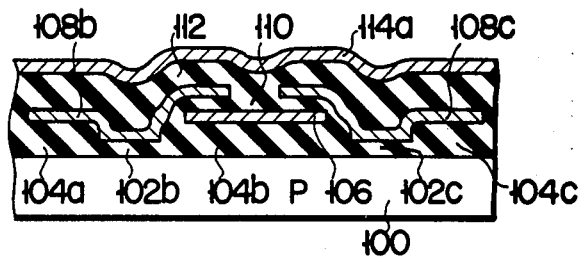
F I G. 14D
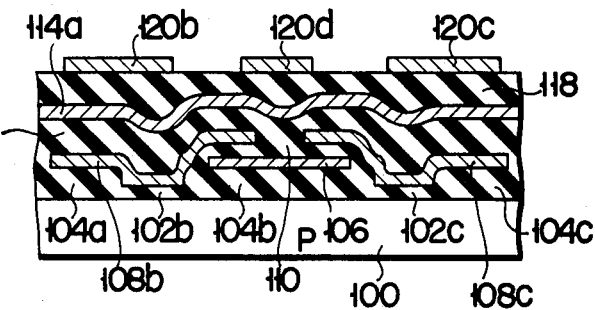
F I G. 14E F I G. 26
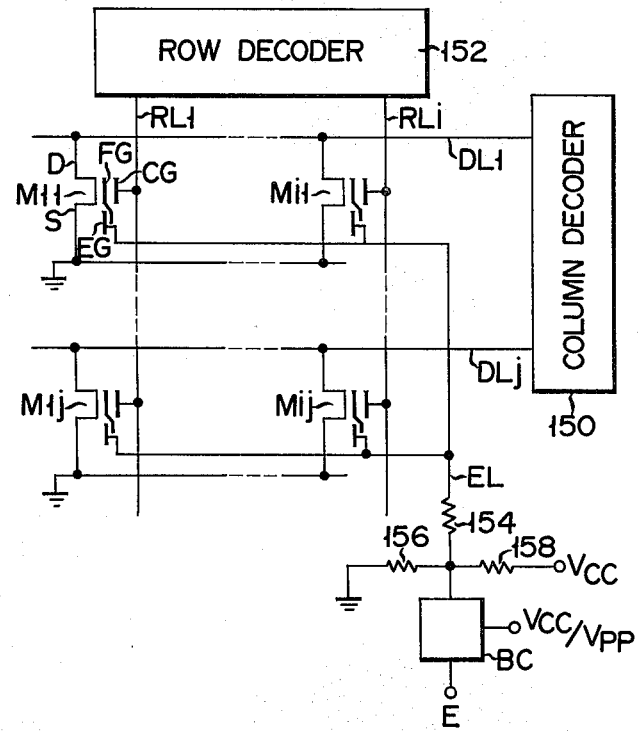

SEMICONDUCTOR MEMORY DEVICE

BACKGROUND OF THE INVENTION

The present invention relates to a semiconductor memory device suitable for an electrically erasable and electrically programmable read-only memory.

Writing and erasing of data after manufacture is possible with an erasable and electrically programmable read-only memory (EP-ROM). The EP-ROMs are roughly classified into the ultraviolet ray erasable type and into the electrically erasable type. A high packaging density may be accomplished with an EP-ROM of the ultraviolet ray erasable type, since one transistor may comprise one memory cell. The ultraviolet ray erasable type EP-ROMs of 32 kbit and 64 kbit have been developed so far. However, the EP-ROMs of the ultraviolet ray erasable type are defective in that manufacturing cost becomes high since a package is required which transmits the ultraviolet rays. On the other hand, a satisfactory packaging density may not be accomplished with the electrically erasable and programmable read-only memory ($E^2$P-ROM) since at least two transistors constitute one memory cell. $E^2$P-ROMs of 16 kbit have so far been developed. However, the $E^2$P-ROMs of the electrically erasable type are advantageous in that manufacturing costs may be reduced by using a less expensive plastic material for the package.

FIG. 1 is a circuit diagram of a memory cell of a conventional $E^2$P-ROM disclosed in "A 16 kb Electrically Erasable Nonvolatile Memory", ISSCC Digest of Technical Papers, 1980, Feb. pp 152 to 153 and 271 by W. S. Johnson et al. This memory cell comprise two transistors Q1 and Q2. The transistor Q1 comprises a select MOS transistor and the transistor Q2 comprises a double gate type MOS transistor having a control gate 50 and a floating gate 52. One doped region of the transistor Q1 is connected to a digit line 54, and the other doped region thereof is connected to one doped region of the transistor Q2. The gate of the transistor Q1 is connected to a select line 56. The other doped region of the transistor Q2 is grounded, and the control gate thereof is connected to a data program line 58.

The conventional $E^2$P-ROMs of the construction as described above have the following drawbacks:

(a1) As may be apparent from FIG. 1, one memory cell comprises two transistors. Therefore, the number of elements becomes twice that of the EP-ROMs of the ultraviolet ray erasable type, resulting in half the packaging density. The EP-ROMs of the electrically erasable type are inferior in the packaging density to those of the ultravoilet ray erasable type.

(a2) Voltages of both polarities of positive and negative are required for writing and erasing of data. Therefore, power sources of both polarities of positive and negative are required for mounting the $E^2$P-ROMs of this type on a printed circuit board and for electrically writing and erasing data therein.

(a3) Extra circuits are required to simultaneously erase data in units of words or all the bits, resulting in a low packaging density.

(a4) It is difficult to erase data of all the bits within a short period of time.

(a5) It is impossible to erase data with a unipolar power source of 5V, for example.

SUMMARY OF THE INVENTION

It is the first object of the present invention to provide a semiconductor memory device which is capable of erasing all data bits in a short period of time.

It is the second object of the present invention to provide the semiconductor memory device which is capable of supplying its own high voltage necessary for erasing data.

It is the third object of the present invention to provide the semiconductor memory device which is capable of quantitatively measuring charge on a floating gate of a memory cell.

In order to achieve the first object of the present invention, there is provided a semiconductor memory device in which a memory cell constituted by a MOS transistor which has a floating gate for writting data is provided with an erase gate, a plurality of such memory cell are then arranged in a matrix form, the erase gates of all the memory cells are commonly connected, and a data erase voltage is applied to the erase gate when data is erased.

In order to achieve the second object of the present invention, the semiconductor memory device is provided with a booster for boosting a power source voltage of the semiconductor memory device or for boosting the write voltage in order to obtain the data erase voltage.

In order to achieve the third object of the present invention, a voltage supplied to an external terminal connected to the erase gate is varied, and the voltage applied to the erase gate in the case of data inversion of the memory cell may be measured.

If a resistor is connected to the erase gate, the memory cell is not damaged even though a high voltage is applied to the erase gate.

BRIEF DESCRIPTION OF THE DRAWINGS

Other objects and advantages of the present invention will become apparent from the following detailed description when taken in conjunction with the accompanying drawings in which:

FIG. 9 is a plan view of a second group of memory cells constituting the semiconductor memory device according to the present invention;

FIGS. 13A to 13E are plan views of a semiconductor substrate for explaining a method for manufacturing the second group of memory cells;

FIGS. 14A to 14E are sectional views along the lines XIVA—XIVA, XIVB—XIVB, . . . , XIVE—XIVE, respectively, of FIGS. 13A to 13E;

FIG. 26 is a circuit diagram of a fourth modification of the semiconductor memory device of FIG. 19.

DETAILED DESCRIPTION OF THE PREFERRED EMBODIMENTS

Figure 2:
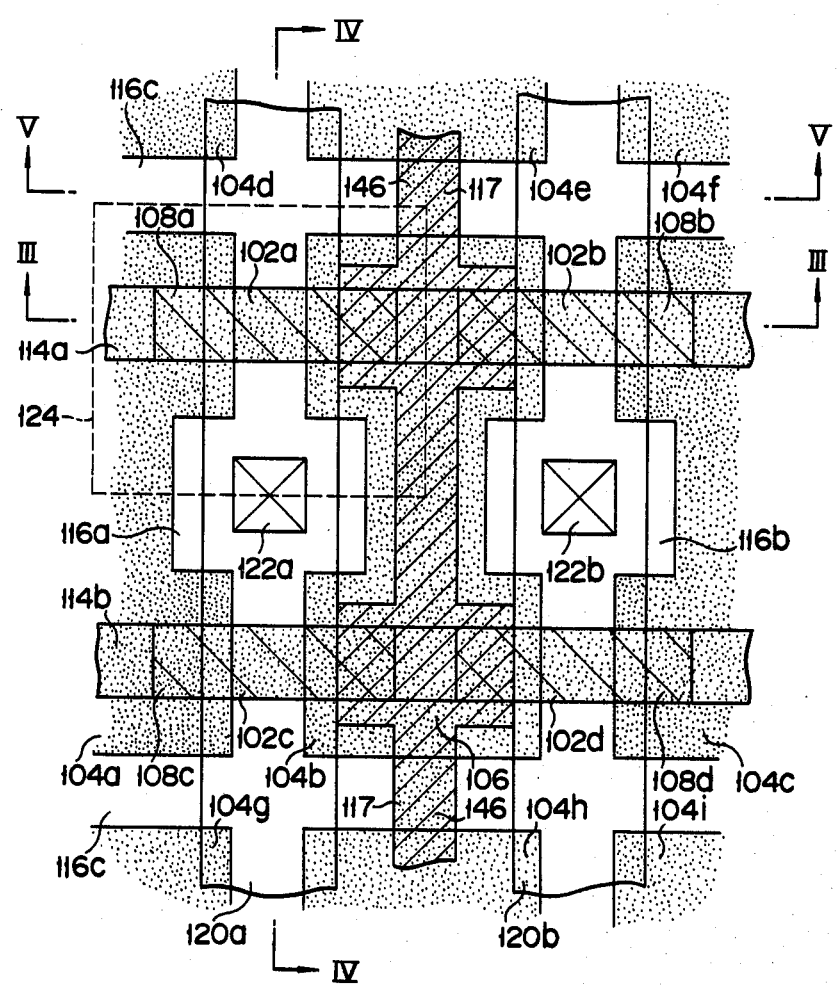
FIG. 2 is a plan view of a first group of memory cells constituting a semiconductor memory device according to the present invention.
Figure 3:
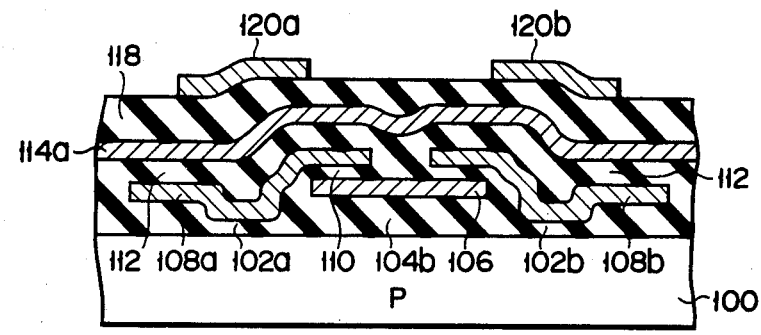
FIG. 3 is a sectional view along the line III—III of FIG. 2.
Figure 4:
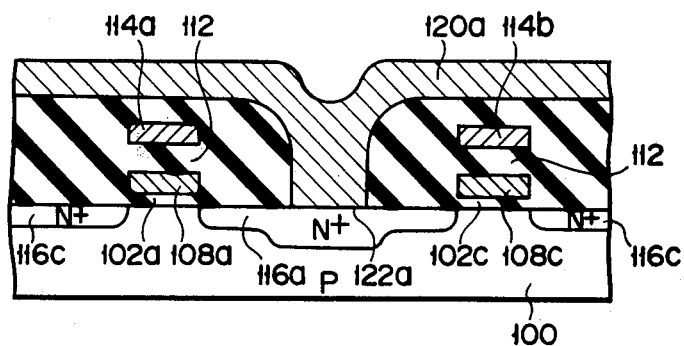
FIG. 4 is a sectional view along the line IV—IV of FIG. 2.
Figure 5:
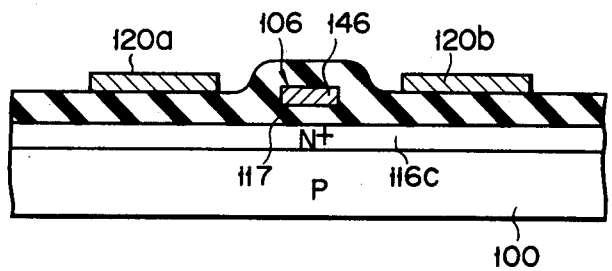
FIG. 5 is a sectional view along the line V—V of FIG. 2.

A first group of memory cells constituting a semiconductor memory device according to the present invention will be described with reference to FIGS. 2 to 5 wherein FIG. 2 is a plan view of memory cells for 4 bits, FIG. 3 is a sectional view along the line III—III of FIG. 2, FIG. 4 is a sectional view along the line IV—IV of FIG. 2, and FIG. 5 is a sectional view along the line V—V of FIG. 2. Referring to FIG. 2, the doped regions of the semiconductor substrate are indicated by the clear areas, the oxide areas are indicated by the dotted areas, and the polycrystalline silicon members are indicated by the cross-hatched areas. Gate insulating films 102a, 102b, 102c and 102d of 500 Å thickness each are formed on the surface of a P-type semiconductor substrate 100 with equal intervals in an X-Y matrix form. On the surface of the semiconductor substrate 100 are also formed field insulating films 104a, . . . 104i. The field insulating film 104b of 1μ thickness is formed between the paired gate insulating films 102a and 102c and the paired gate insulating films 102b and 102d. A first conductive layer 106 which has a thickness of 6,000 Å and which consists of polycrystalline silicon doped with phosphorus or arsenic is formed on the field insulating film 104b.

Second conductive layers 108a, 108b, 108c and 108d which have a thickness of 5,000 Å and which consist of polycrystalline silicon are formed on the gate insulating films 102a, 102b, 102c and 102d, respectively, and are separate from one another. The right edges of the second conductive layers 108a and 108c overlap the left edge of the first conductive layer 106 with an insulating film 110 of 500 Å thickness interposed therebetween. The left edges of the second conductive layers 108b and 108d overlap the right edge of the first conductive layer 106 with this insulating film 110 interposed therebetween.

A third conductive layer 114a of polycrystalline silicon is formed on the second conductive layers 108a and 108b with an insulating film 112 having a thickness of 1,000 to 2,000 Å interposed therebetween. The third conductive layer 114a has substantially the same width as those of the second conductive layers 108a and 108b. Another third conductive layer 114b of polycrystalline silicon is formed on the other second conductive layers 108c and 108d with the insulating film 112 interposed therebetween. This third conductive layer 114b also has substantially the same width as those of the second conductive layers 108c and 108d.

An $N^+$-type semiconductor layer 116a is formed on the surface region of the semiconductor substrate 100 disposed between the gate insulating films 102a and 102c. Another $N^+$-type semiconductor layer 116b is formed on the surface region of the semiconductor substrate 100 disposed between the gate insulating films 102b and 102d. A continuous $N^+$-type semiconductor layer 116c is formed on the surface region of the semiconductor substrate 100 which is opposite to the $N^+$-type semiconductor layers 116a and 116b with respect to the gate insulating films 102a, 102b, 102c and 102d.

An insulating film 117 (FIG. 5) which has a thickness of 1,000 to 2,000 Å is formed at the part disposed between the $N^+$-type semiconductor layer 116c and part 146 of the first conductive layer 106 which is not on the field insulating film. This insulating film 117 is so formed to have a thickness greater than those of the gate insulating films 102a to 102d.

Fourth conductive layers 120a and 120b of aluminum are formed on the third conductive layers 114a and 114b with an insulating film 118 interposed therebetween. The conductive layer 120a and the $N^+$-type semiconductor layer 116a are connected by a contact hole 122a. The conductive layer 120b and the $N^+$-type semiconductor layer 116b are connected by a contact hole 122b. The $N^+$-type semiconductor layer 116c is connected to a point of reference potential, for example, a point of ground potential.

A region 124 surrounded by the broken lines in FIG. 2 shows a memory cell for 1 bit of the first group. As may be apparent from FIG. 3, this memory cell is a MOS transistor having the second conductive layer 108a as a floating gate, the third conductive layer 114a as a control gate, the first conductive layer 106 as an erase gate, the $N^+$-type semiconductor layer 116a as a drain, and the $N^+$-type semiconductor layer 116c as a source.

Referring to FIG. 3, the control gate 114a is commonly used for memory cells of 2 bits, and the erase gate 106 is commonly used for the memory cells of 4 bits. A pair of memory cells having the common gate 114a are formed symmetrical about the erase gate 106. The control gate 114a is formed on the semiconductor substrate 100 with an insulating film interposed therebetween.

The floating gates 108a and 108b and the erase gate 106 are juxtaposed within the insulating film sandwiched by the control gate 114a and the semiconductor substrate 100. Since the erase gate 106 is formed on the field insulating film 104b, parts where the respective floating gates 108a and 108b and the erase gate 106 overlap are formed within the field region. At these overlapping parts, as shown in FIG. 3, the second conductive layer (floating gate) 108a is above the first conductive layer (erase gate) 106. Therefore, the distance between the semiconductor substrate 100 and the first conductive layer 106 is less than that between the semiconductor layer 100 and the second conductive layer 108a.

Figure 1:
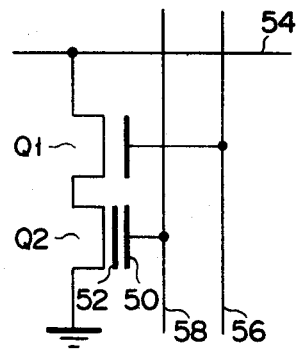
FIG. 1 is a circuit diagram of a memory cell of a conventional $E^2$P-ROM.
Figure 6:
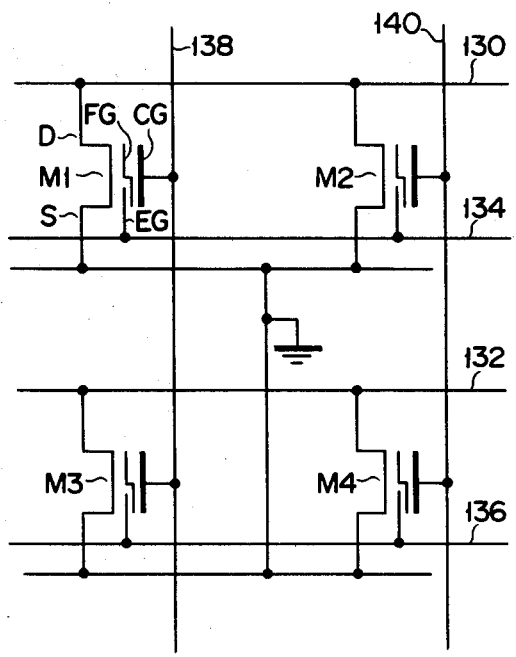
FIG. 6 is an equivalent circuit diagram of the group of memory cells of FIG. 2.

FIG. 6 is an equivalent circuit diagram of the first memory cell group shown in FIG. 2. Digit lines 130 and 132 correspond to the fourth conductive layers 120a and 120b, respectively, shown in FIG. 2, erase lines 134 and 136 correspond to the first conductive layer 106, and select lines 138 and 140 correspond to the third conductive layers 114a and 114b. Each of memory cells M1 to M4 comprises a control gate CG, floating gate FG, an erase gate EG, a drain D and a source S. The drains D of the memory cells M1 and M2 are connected to the digit line 130, the drains D of the memory cells M3 and M4 are connected to the other digit line 132, and the sources S of all the memory cells are connected to a point of ground potential.

The mode of operation of the first group of the memory cells constituting the semiconductor memory device of the present invention will be described with reference to the equivalent circuit diagram shown in FIG. 6. Description will be made with particular reference to the memory cell M1 shown in FIG. 6. Since the electrons are not injected to the floating gate FG of the memory cell M1 at the initial condition, the threshold voltage $V_{TH}$ of the memory cell M1 is at low level.

For writing data in this memory cell M1, a high voltage of positive polarity such as +20V is applied to the select line 138, and a high voltage of positive polarity such as +20V is applied to the digit line 130. Then, thermions flow from the source S to the drain D of the memory cell M1 and these thermions are injected to the floating gate FG from the channel region formed between the source and the drain. As a result of this, the threshold voltage $V_{TH}$ of the memory cell M1 is raised. For writing data, it is also possible to apply a high voltage pulse such as +20V, or a dc voltage of +5 or 0V to the erase line 134, or to open the erase line 134. It thus suffices to apply a predetermined voltage across the source and the drain and to apply a voltage of the same polarity to the first and third conductive layers.

For reading data from the memory cell M1, the select line 138 is selected and a high voltage such as 5V is applied to the control gate CG of the memory cell M1. If the threshold voltage $V_{TH}$ is low when the high voltage is applied, the memory cell M1 is turned on. Then, a current flows from the digit line 130 through the memory cell M1 to the point of ground potential. If the threshold voltage $V_{TH}$ is high when the high voltage is applied, this memory cell M1 is off-state and the current does not flow. If logic level "1" is assigned to the condition wherein the current flows through the memory cell M1, and logic level "0" is assigned to the condition wherein the current does not flow through the memory cell M1, this memory cell may be used as a memory device. Since the floating gate FG is surrounded by the insulating films so as to be insulated from other elements, the electrons injected to the floating gate cannot be emitted outside the floating gate under the normal conditions. Therefore, this memory cell may be used as a nonvolatile memory device.

For erasing the data which has been written, the select line 138 and the digit line 130 are set at 0V and a high voltage pulse such as +40V is applied to the erase line 134. When this voltage is applied, field emission is caused between the floating gate FG and the erase gate EG of the memory cell M1 so that the electrons stored in the floating gate FG are emitted to the outside through the erase gate EG and the erase line 134. Consequently, the threshold voltage $V_{TH}$ of the memory cell M1 is restored to the low level as in the initial condition. For erasing data, it suffices to set the source region, the drain region, and the third conductive layer at substantially the same potential and to apply a voltage of the same polarity as that for writing data to the first conductive layer. If the voltage to be applied to the first conductive layer is greater than that to be applied to the first conductive layer for writing data, erasing of data may be performed with better efficiency.

In erasing data, a high voltage is applied to the erase line 134. However, since the insulating film 117 (FIGS. 2 and 5), thicker than the gate insulating films 102a, 102b, 102c and 102d, is formed between the N+-type semiconductor layer 116c and the part 146 of the first conductive layer which is on the regions other than the field insulating film 104b, the leakage current does not flow through this part.

The first group of the memory cells of the above construction has various advantages to be described below:

(b1) One transistor may constitute one memory cell which is capable of electrically erasing data. Therefore, if a semiconductor memory device is constituted by the memory cell group, the packaging density of the E²P-ROMs may be made substantially the same for the EP-ROMs of the ultraviolet ray erasable type. Since less expensive plastic material may be used for the package, the manufacturing cost is less than that of the EP-ROMs of the ultraviolet erasable type.

(b2) Writing, erasing and reading out data may be performed with unipolar power sources. Power sources are only required to apply +20V for writing, +40V for erasing, and +5V for reading, all of the positive polarity. Furthermore, it is possible to use only a single power source, that is, to dispense with all the other power sources by obtaining +20V and +40V from a voltage of +5V through a booster. Since all the power sources may be mounted on the printed circuit board, the group of the memory cells is capable of writing, erasing and reading out data.

(b3) Unlike conventional E²P-ROMs, the transistor for bit selection is unnecessary. Therefore data may be erased in units of words with ease.

(b4) Since the field emission is utilized for erasing data, data may be erased in a short period of time.

(b5) Since data is written by the injection of thermions and data is erased by the field emission, the insulating films around the floating gate may be formed relatively thick. Therefore, the nonvolatile characteristics, that is, the data holding characteristics, may be improved.

(b6) The method for manufacturing the memory cell described above only requires the process for forming a three-layered polycrystalline silicon film by the conventional silicon gate process and requires no other processes.

(b7) Since the thickness of the field insulating film below the erase gate is greater than that of the insulating film interposed between the erase gate and the floating gate, application of a high voltage to the erase gate for erasing of data only results in discharge between the floating gate and erase gate and does not result in discharge between the semiconductor substrate and the erase gate.

In the first group of memory cells, the floating gate is located above the erase gate at the part where the floating gate overlaps the erase gate. However, the floating gate may be formed below the erase gate at this part. In this case, since the capacitance between the control gate and the floating gate becomes small, an extra voltage must be applied for reading out and writing data.

Figure 7A:
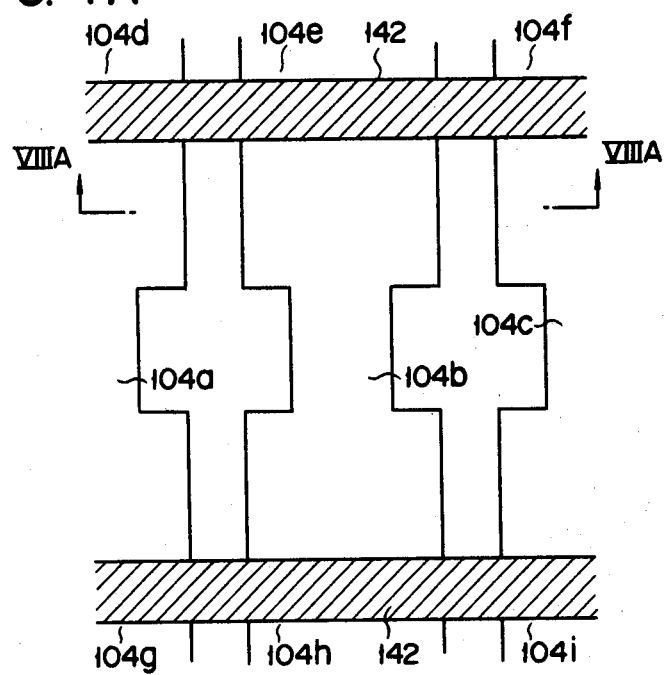
FIGS. 7A to 7E are plan views of a semiconductor substrate for explaining a method for manufacturing the first group of memory cells.
Figure 7B:
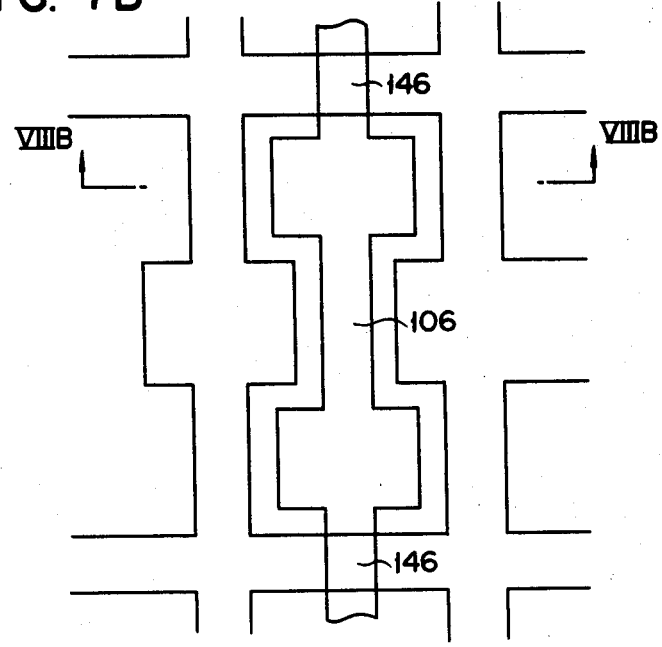

The method for manufacturing the first group of memory cells shown in FIG. 2 will now be described with reference to FIGS. 7A to 7E and FIGS. 8A to 8E. FIGS. 7A to 7E are plan views of the semiconductor substrate and FIGS. 8A to 8E are sectional views along the lines VIIIA—VIIIA, VIIIB—VIIIB, . . . VIIIE—VIIIE, respectively, of FIGS. 7A to 7E. As shown in FIGS. 7A and 8A, an insulating film of 1μ thickness is grown on the surface of the P-type silicon semiconductor substrate 100, and the field insulating films 104a, 104b, . . . 104i are formed by photolithography. In each of regions 142 indicated by hatched lines in FIG. 7A, phosphorus or arsenic is selectively diffused by the ion-implantation method or diffusion method. After this step of diffusing an impurity, the parts of the surface of the semiconductor substrate 100, other than those where the field insulating films 104a to 104i are formed, are exposed. On the exposed surfaces, a thermally oxidized film 144 of a relatively small thickness, i.e., 1,000 to 2,000 Å, is formed by the thermal oxidation method.

Figure 8A:
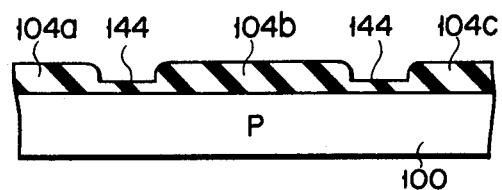
FIGS. 8A to 8E are sectional views along the lines VIIIA—VIIIA, VIIIB—VIIIB, . . . , VIIIE—VIIIE, respectively, of FIGS. 7A to 7E.
Figure 8B:
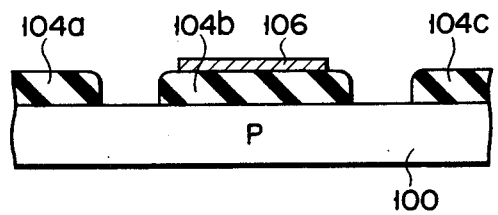

A polycrystalline silicon layer of 6,000 Å thickness is grown on the entire surface of the structure, and phosphorus or arsenic is doped in this polycrystalline silicon. This polycrystalline silicon layer is etched by photolithography to form the first conductive layer 106 as shown in FIGS. 7B and 8B. Using the first conductive layer as a mask, the thermally oxidized film 144 is removed and thereby forms the insulating film 117, having a thickness of 1,000 to 2,000 Å, below the part 146 of the first conductive layer 106. It is to be noted that the first conductive layer may be formed over the field insulating films 104a and 104c, adjacent to the field insulating film 104b.

Figure 7C:
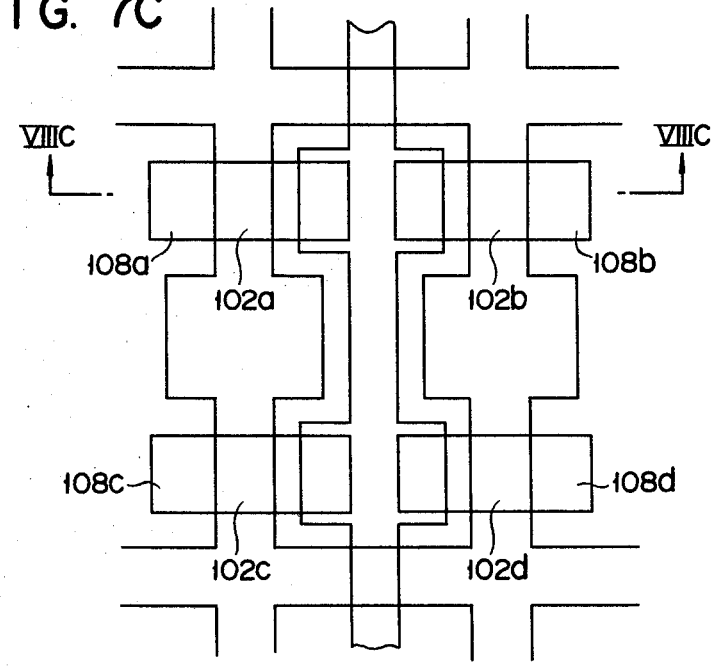
Figure 8C:
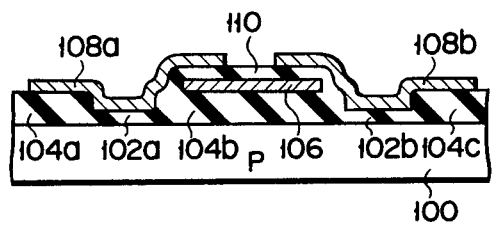

In the next step as shown in FIGS. 7C and 8C, the gate insulating films 102a, 102b, 102c and 102d and the insulating film 100 having a thickness of 500 Å, are formed by the thermal oxidation method on the exposed semiconductor substrate 100 and the first conductive layer 106. A polycrystalline silicon layer of 5,000 Å thickness is grown thereover by the CVD method. The second conductive layers 108a, 108b, 108c and 108d are formed on the gate insulating films 102a, 102b, 102c and 102d by photolithography.

Figure 7D:
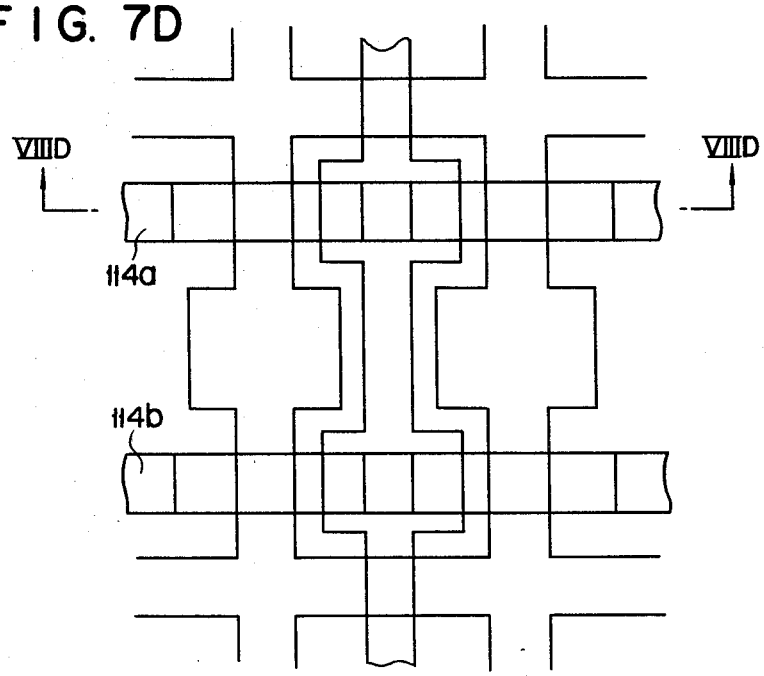
Figure 8D:
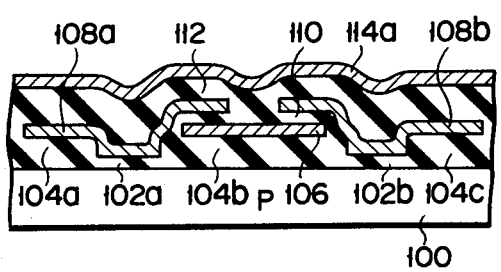

In the next step shown in FIGS. 7D and 8D, the insulating film 112, which has a thickness of 1,000 to 2,000 Å, is formed by the thermal oxidation method and a polycrystalline silicon layer is formed thereover. The polycrystalline silicon layer is etched by photolithography to form the third conductive layers 114a and 114b which are to function as the control gates. Then, using the third conductive layers as a mask, the second conductive layers 108a, 108b, 108c and 108d are etched to form the floating gates in a self-aligned manner.

Figure 7E:
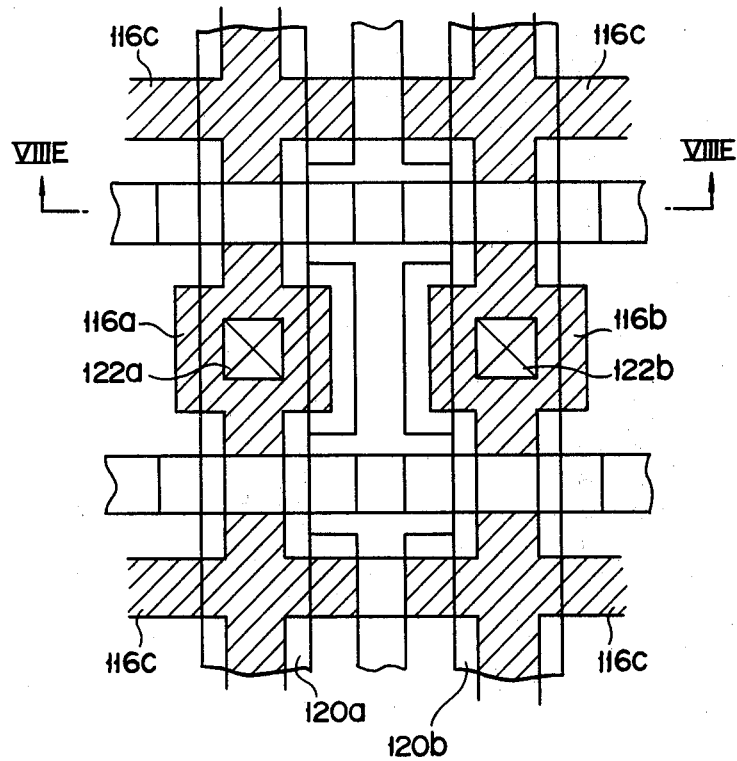
Figure 8E:
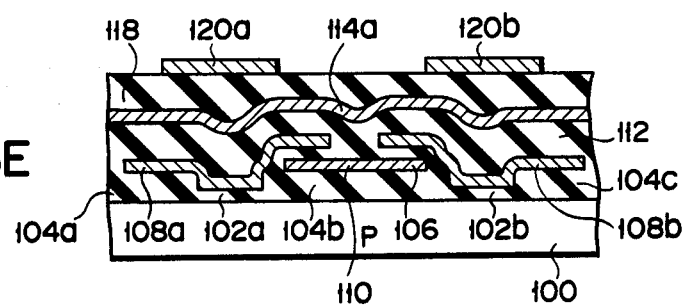

In the next step, using as a mask the second conductive layers 108a to 108d, the third conductive layers 114a and 114b and the field insulating films 104a to 104i, phosphorus or arsenic is diffused in the regions indicated by the hatched lines in FIG. 7E to form the N+-type semiconductor layers 116a, 116b and 116c. Thereafter, the insulating film 118 is deposited over the entire surface of the structure as shown in FIGS. 7E and 8E, to selectively form contact holes in the insulating film 118 which reach the N+-type semiconductor layers 116a and 116b. An aluminum film is then deposited over the insulating film 118 and the aluminum film is selectively etched by photolithography to form the fourth conductive layers 120a and 120b. The fourth conductive layers 120a and 120b are connected to the N+-type semiconductor layers 116a and 116b through the contact holes 122a and 122b, respectively.

The first memory cell group is not limited to those described above. For example, it is also possible to form the first conductive layer on the field insulating film 104a and to make the other edges of the second conductive layers 108a and 108c overlap, with an insulating film interposed therebetween, with the first conductive layer on the field insulating film 104c. Alternatively, it is also possible to form the first conductive layer on the field insulating film 104c and to make the other edges of the second conductive layers 108b and 108d overlap, with an insulating film interposed therebetween, with the first conductive layer on the field insulating film 104c.

In the above-described group of memory cells, the first conductive layer 106 to function as the erase gate is common to the floating gates which are symmetrically arranged about this conductive layer. However, it is to be understood that the erase gate may be so formed as to erase the data of floating gate of only one memory cell.

The first conductive layer 106 and the second conductive layers 108a to 108d may be made of molybdenum.

Figure 10:
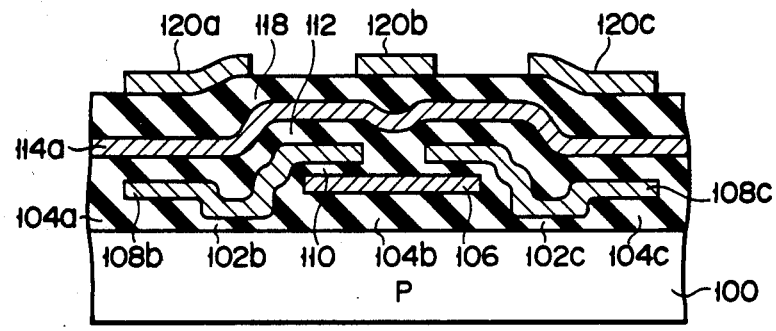
FIG. 10 is a sectional view along the line X—X of FIG. 9.
Figure 11:
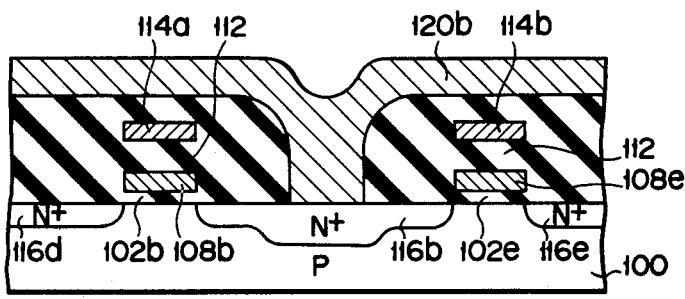
FIG. 11 is a sectional view along the line XI—XI of FIG. 9.
Figure 12:
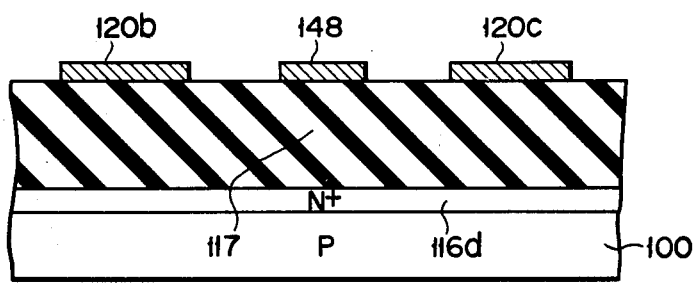
FIG. 12 is a sectional view along the line XII—XII of FIG. 9.

A second group of memory cells constituting a semiconductor memory device of the present invention will now be described referring to FIGS. 9 to 12. FIG. 9 is a plan view of a plurality of memory cells, FIG. 10 is a sectional view along the line X—X of FIG. 9, FIG. 11 is a sectional view along the line XI—XI of FIG. 9, and FIG. 12 is a sectional view along the line XII—XII of FIG. 9. Referring to FIG. 9, the doped regions of the semiconductor substrate 100 are indicated by the clear areas, the oxide areas are indicated by the dotted areas, and the polycrystalline silicon members are indicated by the cross-hatched areas.

The gate insulating films 102a to 102f of 500 Å thickness are formed on the surface of the P-type silicon semiconductor substrate 100 with equal intervals therebetween in an X-Y matrix form. The field insulating films 104a, 104b, . . . , 104i are also formed on the surface of the semiconductor substrate 100. The field insulating film 104a is formed between the paired gate insulating films 102a and 102d and the paired gate insulating films 102b and 102e. The field insulating film 104b is formed between the paired gate insulating films 102b and 102e and the paired gate insulating films 102c and 102f. The field insulating film 104c is formed at the other edges of the paired gate insulating films 102c and 102f.

The first conductive layer 106, having a thickness of 6,000 Å and consisting of polycrystalline silicon doped with phosphorus or arsenic, is formed in an island form. The second conductive layers 108a, 108b, 108c, 108d, 108e and 108f having a thickness of 5,000 Å and consisting of polycrystalline silicon, are formed on the gate insulating films 102a, 102b, 102c, 102d, 102e and 102f respectively, to be separate from each other. The respective right edges of the second conductive layers 108b and 108e overlap the left edge of the first conductive layer 106 with the insulating film 110 of 500 Å thickness interposed therebetween. The left edges of the second conductive layers 108c and 108f also overlap the right edge of the first conductive layer 106 with the insulating film 110 interposed therebetween.

The third insulating film 112, which has a thickness of 1,000 to 2,000 Å and which consists of polycrystalline silicon, is formed on the second conductive layers 108a, 108b and 108c with the insulating film 112 interposed therebetween. The third conductive layer 114a has substantially the same width as those of the second conductive layers 108a, 108b and 108c. The third conductive layer 114b of polycrystalline silicon is formed on the second conductive layers 108d, 108e and 108f with the insulating film 112 interposed therebetween. The third insulating film 114b also has the same width as those of the second conductive layers 108d, 108e and 108f.

The N+-type semiconductor layer 116a is formed on the surface region of the semiconductor substrate 100 which is disposed between the gate insulating film 102a and the gate insulating film 102d. The N+-type semiconductor layer 116b is formed on the surface region of the semiconductor substrate 100 which is disposed between the gate insulating film 102b and the gate insulating film 102e. The N+-type semiconductor layer 116c is formed on the surface region of the semiconductor substrate 100 which is disposed between the gate insulating film 102c and the gate insulating film 102f. The continuous N+-type semiconductor layer 116d is formed on the surface region of the semiconductor substrate 100 which is opposite to the N+-type semiconductor layers 116a, 116b and 116c with respect to the gate insulating films 102a, 102b and 102c. A continuous semiconductor layer 116e is formed on the surface region of the semiconductor substrate 100 which is opposite to the N+-type semiconductor layers 116a, 116b and 116c with respect to the gate insulating films 102d, 102e and 102f.

The fourth conductive layers 120a, 120b, 120c and 120d, all of aluminum, are formed with the insulating film 118 interposed therebetween, on the third conductive layers 114a and 114b and the first conductive layer 106. The fourth conductive layer 120a and the N+-type semiconductor layer 116a are connected through the contact hole 122a. The fourth conductive layer 120b and the N+-type semiconductor layer 116b are connected through the contact hole 122b. The fourth conductive layer 120c and the N+-type semiconductive layer 116c are connected through a contact hole 122c. The fourth conductive layer 120d is connected to the first conductive layer 106 through a contact hole 122d.

An insulating film 117 of a thickness greater than that for the first group of memory cells is disposed between a part 148 of the fourth layer 120d which is not on the field insulating film 104b and the N+-type semiconductor layers 116d and 116e (FIG. 12). The thickness of the insulating film 117 is greater than those of the gate insulating films 102a to 102f. The N+-type semiconductor layers 116d and 116e are connected to a point of reference potential, for example, a point of ground potential.

The region 124 indicated by the broken line in FIG. 9 indicates a memory cell for 1 bit of the second memory cell group. This memory cell is a MOS transistor which has, as is apparent from FIG. 9, the second conductive layer 108b as a floating gate, the third conductive layer 114a as a control gate, the first conductive layer 106 as an erase gate, the N+-type semiconductor layer 116b as a drain, and the N+-type semiconductor layer 116d as a source.

As may be seen from FIG. 10, the control gate 114a is common to memory cells for 2 bits, and the island-shaped erase gate 106 is formed commonly for the memory cells for 4 bits. A pair of memory cells having the common control gate 114a are formed symmetrically about the erase gate 106. The control gate 114a is formed on the semiconductor substrate 100 with the insulating film interposed therebetween. The floating gates 108b and 108c, and the erase gate 106 are juxtaposed in the insulating film interposed between the erase gate 114a and the semiconductor substrate 100. Since the erase gate 106 is formed on the field insulating film 104b, parts of the floating gates 108b and 108c overlapping with the erase gate 106 are present in the field region.

As also seen from FIG. 10, at this overlapping part, the floating gate (the second conductive layer) 108a is located above the erase gate (the first conductive layer) 106. Therefore, the distance between the semiconductor substrate 100 and the first conductive layer 106 is smaller than the distance between the semiconductor substrate 100 and the second conductive layer 108a.

The equivalent circuit of the second memory cell group shown in FIGS. 9 to 11 is of the same configuration as the first memory cell group shown in FIG. 6. The operation of this equivalent circuit is also the same as that in the first memory group, so that the description thereof will be omitted.

The second group of memory cells has, in addition to the seven advantages of the first group, two more advantages described below:

(b8) Since the erase line comprises the fourth conductive layer 120d of aluminum, the thick insulating film 117 may be formed between the N+-type semiconductor layers 116d and 116e and the part 148 of the fourth conductive layer formed on the region other than on the field insulating film 104b. Consequently, the current leakage is not caused even if a high voltage is applied to the erase line.

(b9) The fourth conductive layer 120d and the erase gate for 4 bits may be connected through a single contact hole if the erase gate is formed to be common for memory cells for 4 bits as in the second group of memory cells. Therefore, the number of the contact holes may be reduced and the packaging density may be improved.

Figure 13A:
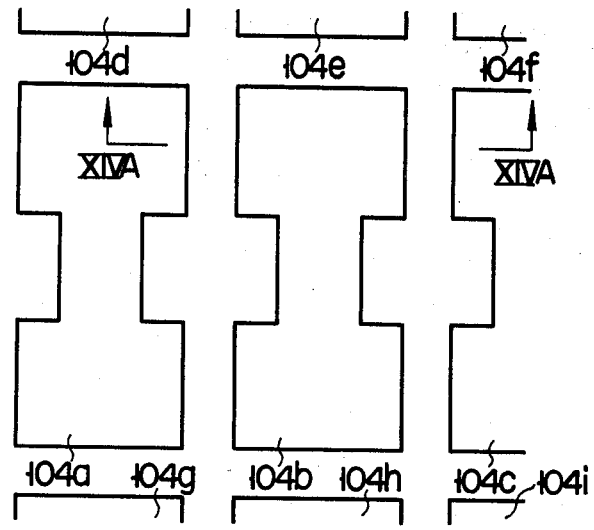
Figure 13B:
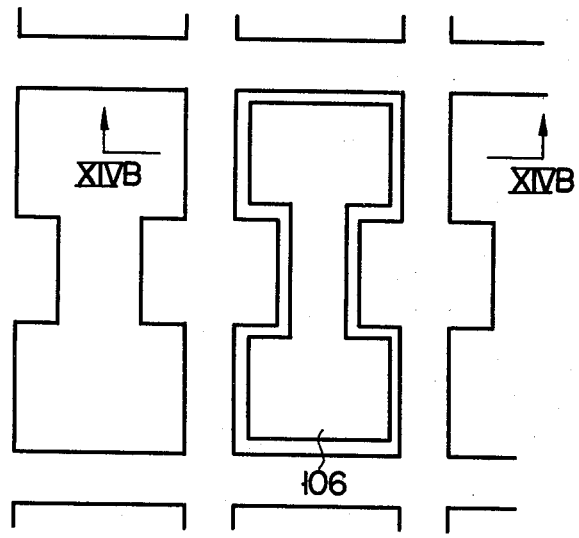

The method for manufacturing the second group of memory cells will be described with reference to FIGS. 13A to 13E and FIGS. 14A to 14E. FIGS. 13A to 13E are plan views of the semiconductor substrate, and FIGS. 14A to 14E are sectional views along the lines XIVA—XIVA, XIVB—XIVB, . . . , XIVE—XIVE, respectively, of FIGS. 13A to 13E. As shown in FIGS. 13A and 14A, an insulating film of 1μ thickness is grown on the surface of the P-type silicon semiconductor substrate 100. The field insulating films 104a, 104b, 104c, 104d, 104e, 104f, 104g, 104h and 104i are formed by photolithography. A polycrystalline silicon layer of 6,000 Å thickness is grown over the entire surface of the structure. Phosphorus or arsenic is doped in this polycrystalline silicon layer. The polycrystalline silicon layer is etched by photolithography to form the first conductive layer 106 on the field insulating film 104b as shown in FIGS. 13B and 14B. The first conductive layer may also be formed as needed on the field insulating films 104a, 104b, 104c, 104d, 104e, 104f, 104g, 104h and 104*i* which are adjacent to the field insulating film 104*b*.

Figure 13C:
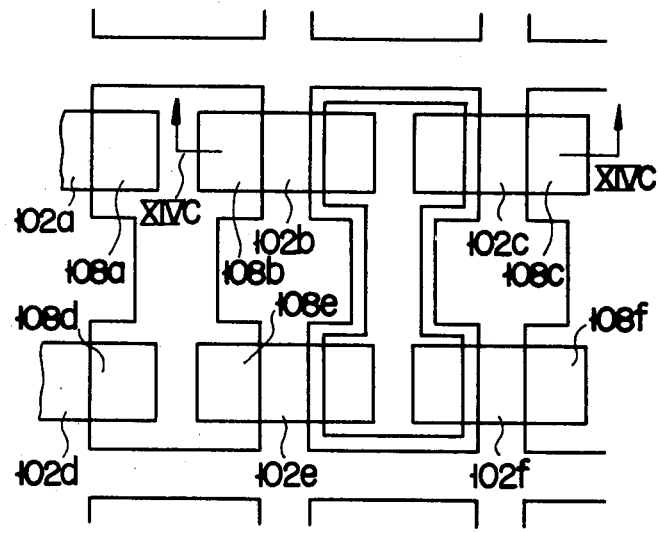

In the next step, as shown in FIGS. 13*c* and 14*c*, the insulating film 110 and the gate insulating films 102*a*, 102*b*, 102*c*, 102*d*, 102*e* and 102*f* which have a thickness of 500 Å are formed by the thermal oxidation method on the first conductive layer 106 and the exposed semiconductor substrate 100, respectively. A polycrystalline silicon layer of 5,000 Å is grown by the CVD method thereover, and the second conductive layers 108*a* to 108*f* as the floating gates are formed on the gate insulating films 102*a* to 102*f* and the insulating film 110.

Figure 13D:
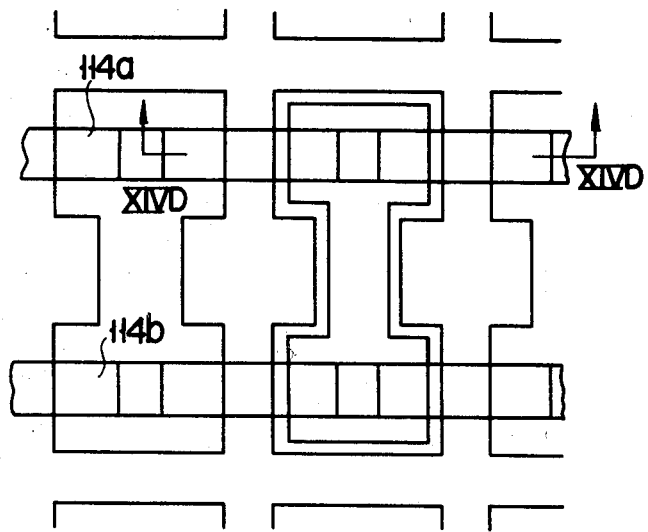

In the next step as shown in FIGS. 13D and 14D, the insulating film 112 which has a thickness of 1,000 to 2,000 Å is formed by the thermal oxidation method, and a polycrystalline silicon layer is formed thereover. The polycrystalline silicon layer is etched by photolithography to form the third conductive layers 114*a* and 114*b* to function as the control gates. Using the third conductive layers as a mask, the second conductive layers 108*a* to 108*f* are etched to form the floating gates in a self-aligned manner.

Using as a mask the second conductive layers 108*a* to 108*f*, the third conductive layers 114*a* and 114*b*, and the field insulating films 104*a* to 104*i*, phosphorus or arsenic is doped in the region indicated by the hatched lines in FIG. 13E to form the N+-type semiconductor layers 116*a*, 116*b* and 116*c* as the drains and N+-type semiconductor layers 116*d* and 116*e* as the sources. Thereafter, as shown in FIGS. 13E and 14E, the insulating film 118 is deposited on the entire surface of the structure and holes are selectively formed which extend to the N+-type semiconductor layers 116*a*, 116*b* and 116*c* and the first conductive layer 106. After an aluminum film is deposited over the insulating film 118, this aluminum film is selectively etched by photolithography to form the fourth conductive layers 120*a*, 120*b*, 120*c* and 120*d*. The fourth conductive layers 120*a*, 120*b* and 120*c* are connected to the N+-type semiconductor layers 116*a*, 116*b* and 116*c* through the contact holes 122*a*, 122*b* and 122*c*, respectively. The fourth conductive layer 120*d* is connected to the first conductive layer 106 through the contact hole 122*d*.

In the second group of memory cells, one erase gate is commonly formed for memory cells for 4 bits. However, it is also possible to form one erase gate for a memory cell for 1 bit or to form one erase gate for memory cells for 2 bits.

Figure 15:
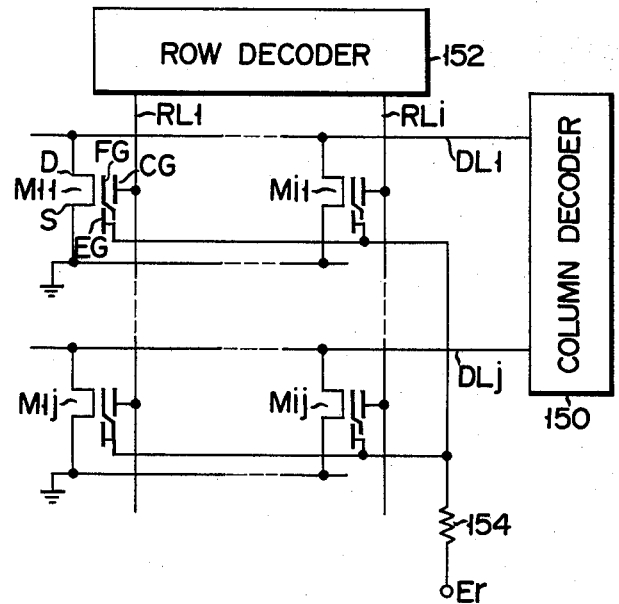
FIG. 15 is a circuit diagram of a first embodiment of a semiconductor memory device according to the present invention.

The semiconductor memory device according to the first embodiment of the present invention will now be described with reference to FIG. 15. FIG. 15 shows a semiconductor memory device of i×j bits which adopts the first or second group of memory cells described above. The semiconductor memory device has memory cells numbering i in the column direction and j in the row direction which are arranged in a matrix form. These memory cells Ml1 to Mij have control gates CG, floating gates FG, erase gates EG, drains D and sources S. The drains D of the memory cells aligned on the same column are commonly connected to digit lines DL1 to DLj numbering j, respectively. The digit lines DL1 to DLj are connected to output terminals of a column decoder 150.

A column address is input to the column decoder 150 and an output terminal of the column decoder 150 is selected according to the column address when data is read out or written. A high voltage such as +5V or +20V is output from the selected output terminal, and low voltage of 0V, for example, are output from the nonselected output terminals. The control gates CG of the respective memory cells numbering j in the same rows are commonly connected to respective row lines RL1 to RLi numbering i. These row lines RL1 to RLi numbering i are also connected to the output terminals of a row decoder 152, respectively. A row address is input to this row decoder 152, and one output terminal thereof is selected according to this row address when reading out or writing data. A high voltage is output from the selected output terminal alone, and low voltages are output from all of the nonselected output terminals. The erase gates EG of all the memory cells are commonly connected and also to an erase terminal Er through a protective resistor 154. The sources of all the memory cells are commonly connected as well as to the point of ground potential.

A data erasing voltage of, for example, +40V is applied to the erasing terminal Er when erasing data stored in the respective memory cells.

In the semiconductor memory device with this arrangement, when an erase voltage (+40V) is applied to the erase terminal Er, data in all the memory cells is spontaneously erased. The data is erased in a short period of time since field emission is used. Even if an abnormally high voltage is applied to the erase terminal Er, the memory cell is not damaged since a resistor 154 is connected in series with the erase terminal Er and the high voltage described above is applied across both terminals of the resistor 154. The resistance of the resistor 154 is preferably higher than 1 kΩ to protect the memory cell. Furthermore, the resistor 154 is preferably made of polycrystalline silicon formed on the thick field insulating film. In this manner, if the resistor 154 is made of polycrystalline silicon, a p-n junction is not formed unlike in the case wherein the resistor 154 is formed as a diffusion resistor. Therefore, the resistance of the resistor 154 is made sufficiently high.

The first modification of the semicondutor memory device shown in FIG. 15 will be described with reference to FIG. 16. A resistor 156, one end of which is grounded, is connected to the erase terminal Er. Since this modification is the same as the first embodiment of the semiconductor memory device shown in FIG. 15 except for the point described above, the same reference numerals in FIG. 15 denote the same parts in FIG. 16 and the description thereof will be omitted. When the semiconductor memory device is arranged in a manner described above, the erase gate EG of each memory cell is set at the ground potential by the resistor 156 even if the erase terminal Er is opened electrically when data is read out or written. Therefore, the erase gate EG of each memory cell is not set in the floating condition, so that an erratic operation of the memory cell due to noise may be prevented. Further, when data is not erased, the erase gate EG is set at the ground potential, so that the floating gate FG is biased to a potential close to the gound potential by coupling of the overlapped area between the floating gate FG and the erase gate EG. As a result, a threshold voltage $V_{TH}$ of the memory cell becomes deep, that is, high.

The second modification of the semiconductor memory device shown in FIG. 15 will be described with reference to FIG. 17. One end of a resistor 158 is connected to a power source voltage Vcc of positive polarity, for example, of +5V and the other end thereof is connected to the erase terminal Er. This modifiction is the same as the first embodiment except for the point described above. Therefore, the same reference numerals in FIG. 15 denote the same parts in FIG. 17 and the description thereof will be omitted. In the semiconductor memory device with the above arrangement, the erase gate EG of each memory cell is set at the Vcc potential by the resistor 158 even if the erase terminal Er is opened electrically when data is not erased as shown in the first modification of FIG. 16. Therefore, the erase gate EG is not set in the floating condition, and an erratic operation of the memory cell due to noise may be prevented. When data is not erased, the erase gate EG is set at the Vcc potential and the floating gate FG is biased to a potential close to the Vcc potential by coupling of the overlapped area between the floating gate FG and the erase gate EG. Therefore, in this case, the threshold voltage of the memory cell becomes shallow, that is low.

The third modification of the semiconductor memory device shown in FIG. 15 will be described with reference to FIG. 18. One end of the resistor 156 whose other end is grounded and one end of the resistor 158 whose other end receives the power source voltage Vcc of positive polarity, for example, of +5V are connected to the erase terminal Er. The third modification is the same as the first embodiment except for the point described above. The same reference numerals in FIG. 15 denote the same parts in FIG. 18 and the description thereof will be omitted. In the semiconductor memory device with this arrangement, the erase gate EG is set at a predetermined potential between the ground potential and the Vcc potential when data is not erased.

Figure 16:
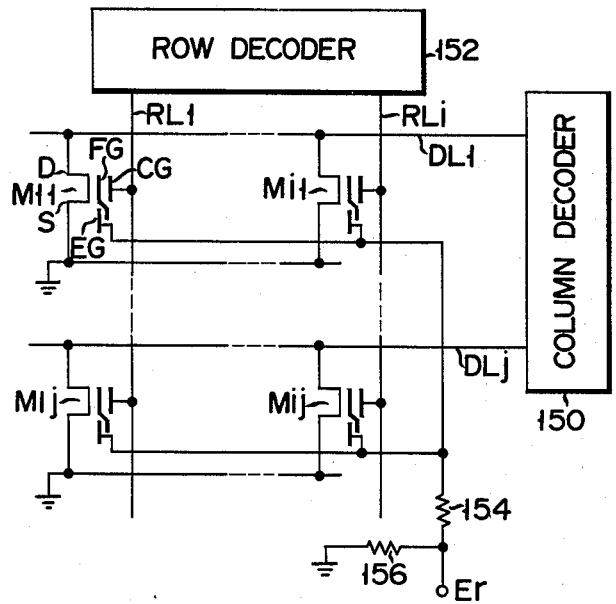
FIG. 16 is a circuit diagram of a first modification of the semiconductor memory device of FIG. 15.
Figure 17:
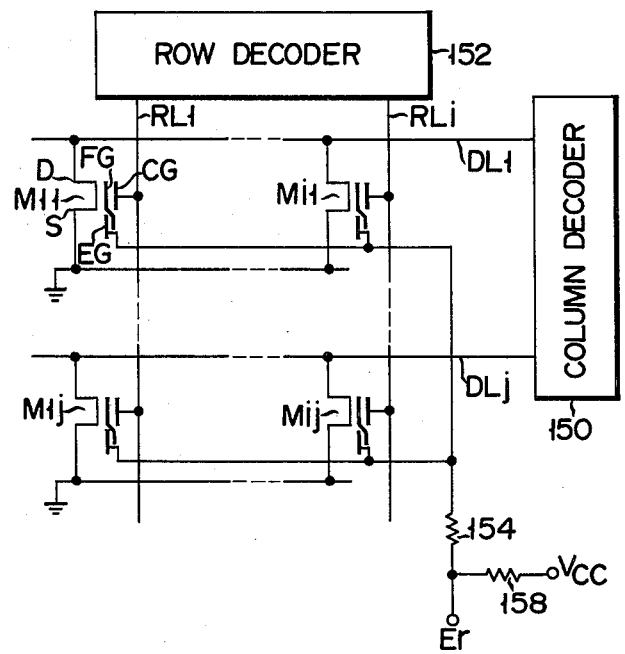
FIG. 17 is a circuit diagram of a second modification of the semiconductor memory device of FIG. 15.
Figure 18:
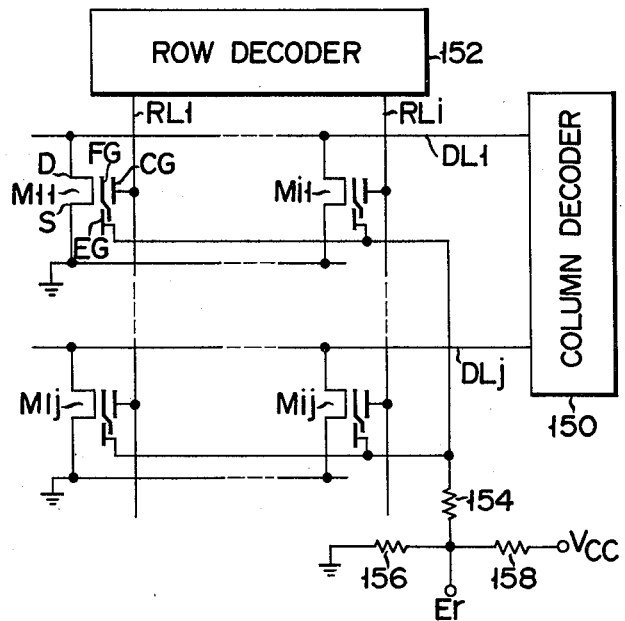
FIG. 18 is a circuit diagram of a third modification of the semiconductor memory device of FIG. 15.

Furthermore, in order to protect effectively the memory cell in the modifications shown in FIGS. 16 to 18, the resistance of the resistor 154 is preferably higher than that of the resistors 156 and 158. The resistances of all the resistors 154, 156 and 158 are preferably higher than 1 kΩ.

In the semicoductor memory devices shown in FIGS. 15 to 18, the erase gates of all the memory cells are commonly connected in each column and are connected to the erase terminals Er through the resistors 154. However, the erase gates EG of the memory cells may be commonly connected in each row.

Figure 19:
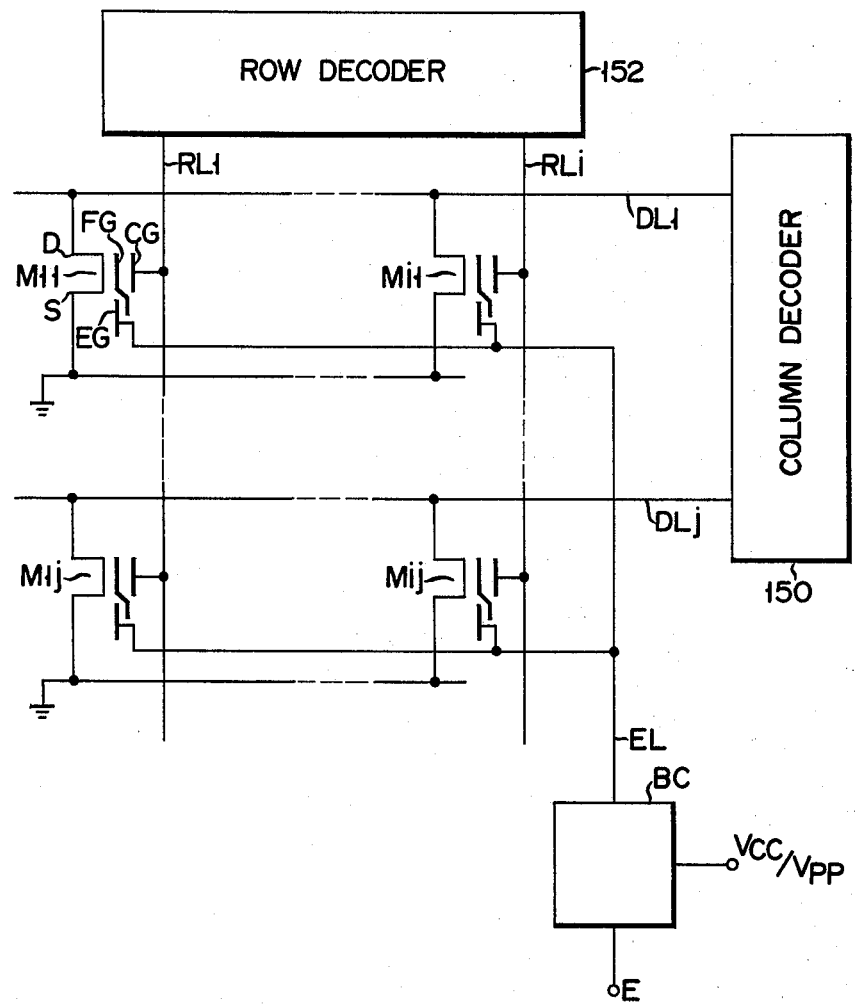
FIG. 19 is a circuit diagram of a second embodiment of a semiconductor memory device according to the present invention.

With reference to FIG. 19 a second embodiment of a semiconductor memory device according to the present invention will be described. FIG. 19 shows a semiconductor memory device of i×j bits, using the first or second group of memory cells. The memory cells are arranged in the matrix form. They number i in the column direction and j in the row direction. Each of the memory cells Mll to Mij comprises a control gate CG, a floating gate FG, an erase gate EG, a drain D and a source S. The drains D of the memory cells numbering i in the same column are commonly connected to respective digit lines DL1 to DLj numbering i. The digit lines DL1 to DLj numbering j are connected to the output terminals of a column decoder 150, respectively. A column address is input to this column decoder 150 and, one output terminal thereof is selected according to this column address when reading out or writing data. A higher voltage such as +5V or +20V is output from the selected output terminal, and low voltages of 0V, for example, are output from the nonselected output terminals.

The control gates CG of the memory cells numbering j in the same rows are commonly connected to respective row lines RL1 to RLi numbering i. These row lines RL1 to RLi numbering i are also connected to the output terminals of a row decoder 152, respectively. A row address is input to this row decoder 152, and one output terminal thereof is selected according to this row address when reading out or writing data. A signal of high level is output only at the selected output terminal and a signal of low level is output at other nonselected output terminals. The erase gates EG of all the memory cells are connected to erase lines EL which are in turn connected to output terminals of boosters BC. The sources S are commonly grounded.

The booster BC boosts a write voltage Vpp of +20V for writing data or the power source voltage Vcc of +5V and supplies the data erase voltage of +40V. The boosting operation of the booster is only performed during the period for which a data erase control signal E is at high level.

In the semiconductor memory device with the above arrangement, when the data erase control signal E becomes high level when data is erased, the power source voltage Vcc of +5V or the write voltage Vpp of +20V is boosted to the erase voltage of +40V and the erase voltage is supplied to each erase gate EG through each erase line EL. Therefore, data in all the memory cells is spontaneously erased.

When the booster BC described above is incorporated, the following advantages are obtained:

(c1) Data can be electrically erased with only the power source voltage Vcc and the write voltage Vpp.

(c2) Since the data erase voltage is obtained by boosting the power source voltage Vcc or the write voltage Vpp, all the circuits can be mounted on a printed circuit board and still data erasure may be performed.

(c3) Since the data erase voltage is obtained by boosting the power source voltage Vcc or the write voltage Vpp, input pins for applying a voltage to erase data are not required. Therefore, the semiconductor memory device according to the present invention is pincompatible with the semiconductor memory devices of the ultraviolet erasable type manufactured hitherto.

Figure 20:
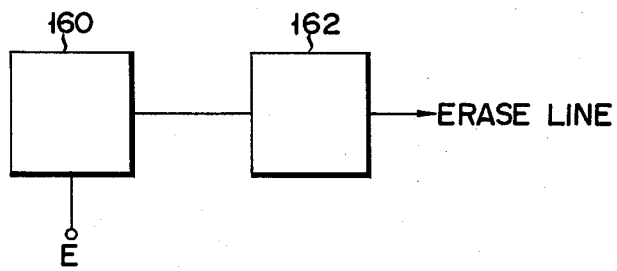
FIG. 20 is a block diagram of a booster used in the semiconductor memory device of FIG. 19.

FIG. 20 is a block diagram of a booster BC described above. The booster BC comprises an oscillation section 160 which is controlled by the data erase control signal E and a boosting section 162 which boosts an oscillated output from the oscillation section 160.

Figure 21:
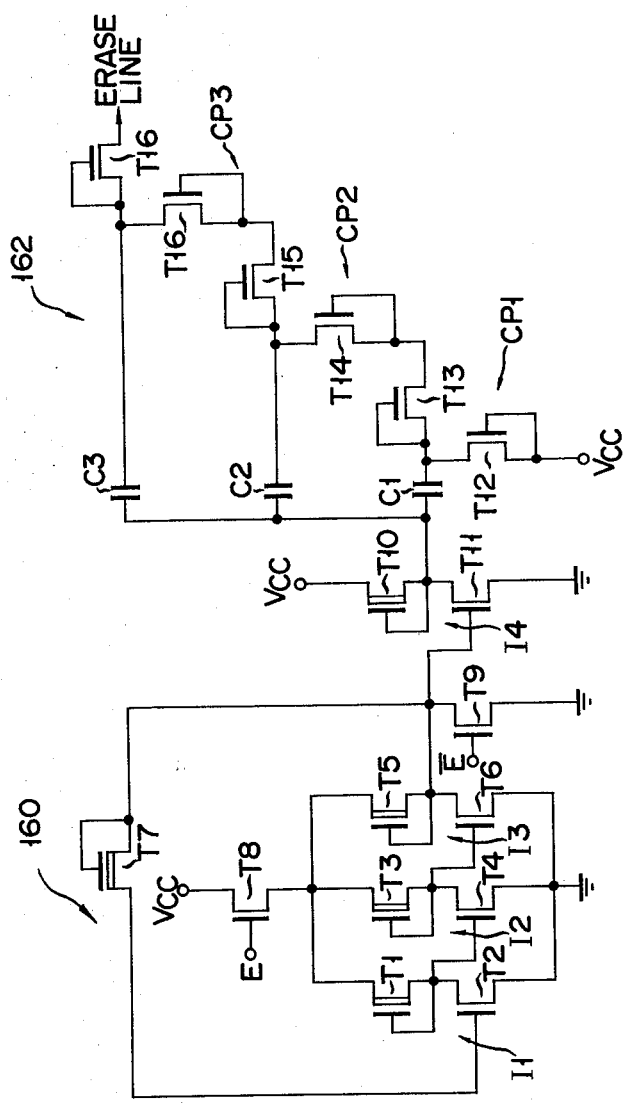
FIGS. 21 and 22 are circuit diagrams of the booster.

FIG. 21 is a circuit diagram of the booster BC shown in FIG. 20. The oscillation section 160 is constituted by a ring oscillator comprising an inverter I1 having a MOS transistor T1 of depletion type and a MOS transistor T2 of enhancement type, an inverter I2 having a MOS transistor T3 of depletion type and a MOS transistor T4 of enhancement type, an inverter I3 having a MOS transistor T5 of depletion type and a MOS transistor T6 of enhancement type, a MOS transistor T7 of depletion type which operates as a feedback resistor, a MOS transistor T8 which receives the data control signal E at its gate and which controls oscillation, and a MOS transistor T9 of enhancement type the gate of which receives an inverted signal $\overline{E}$ of the data control signal E. The threshold voltage of the MOS transistor T8 is substantially 0 or is set in the enhancement mode.

On the other hand, the boosting section 162 comprises an inverter I4 having a MOS transistor T10 of depletion type and a MOS transistor T11 of enhancement type, a charge pump CP1 having a capacitor C1 and a MOS transistors T12 and T13 of enhancement type, a charge pump CP2 having a capacitor C2 and MOS transistors T14 and T15 of enhancement type, and a charge pump CP3 having a capacitor C3 and MOS transistors T16 and T17 of enhancement type. The charge pumps CP1, CP2 and CP3 constitute a charge pump circuit. The MOS transistors T1, T2, ..., T17 are all n-channel transistors.

In the circuit shown in FIG. 21, when the data erase control signal E is at high level, the transistor T8 is rendered conductive and the transistor T9 is turned off so that oscillation is initiated. An oscillation output from the oscillation section 160 is supplied to the respective charge pumps through the inverter I4. As a result, the power source voltage Vcc of +5V is boosted and the erase voltage of, for example, +40V is obtained. The output from the inverter I4 is switched and the transistors T12 to T16 function as diodes, that is, as valves of the pump, so that the erase line EL is charged at the positive potential.

Figure 22:
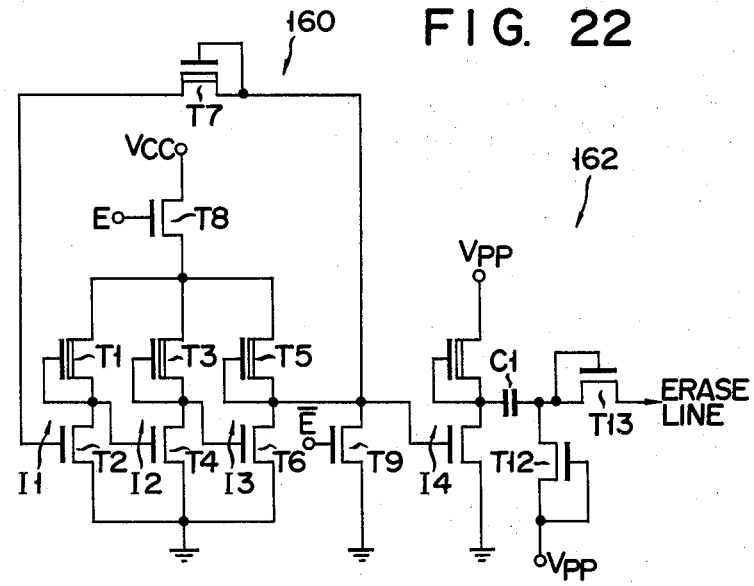

FIG. 22 is another circuit diagram of the booster BC. The oscillation section 160 is the same as the arrangement shown in FIG. 21. The boosting section 162 is a circuit in which the write voltage Vpp is boosted. The boosting section 162 comprises the inverter I4 one end of which receives the write voltage Vpp and the other end of which is grounded, and the charge pump CP1 having the capacitor C1 and the MOS transistors T12 and T13 of enhancement type. The input end of the charge pump CP1 is connected to the inverter I4 and the output end of the charge pump CP1 is connected to the erase line. The write voltage Vpp is supplied to the transistor T12. With the booster BC described above, the write voltage of +40V is boosted to obtain the erase voltage of +40V.

Figure 23:
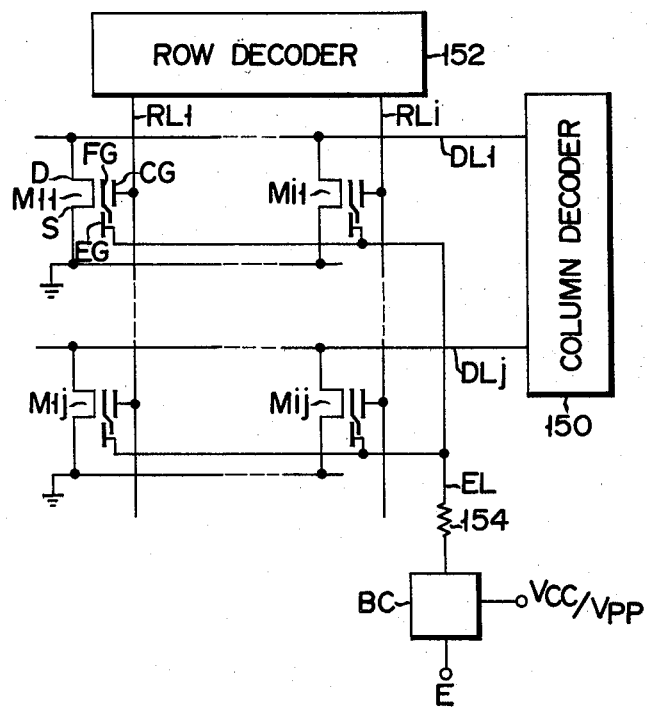
FIG. 23 is a circuit diagram of a first modification of the semiconductor memory device of FIG. 19.

The first modification of the second semiconductor memory device shown in FIG. 19 will be described with reference to FIG. 23. The resistor 154 is arranged between the erase line EL and the output end of the booster BC in order to protect the memory cell. The first modification is the same as the arrangement of the second semiconductor memory device shown in FIG. 19 except for the point described above. The same reference numerals in FIG. 19 denote the same parts in FIG. 23 and the description therof will be omitted. When the resistor 154 is arranged as described above, even if an abnormally high voltage is applied to the resistor 154 from the booster BC, the memory cell may not be damaged since the high voltage is applied across both terminals of the resistor 154. In order to protect the memory cell, the resistance of the resistor 154 is preferably higher than 1 kΩ. The resistor 154 is preferably made of polycrystalline silicon formed on the field insulating film. With this structure, a p-n junction is not formed unlike in this case wherein the resistor 154 is formed as a diffusion resistor. Therefore, the resistance of the resistor 154 is made sufficiently high.

The second modification of the second semiconductor memory device shown in FIG. 19 will be described with reference to FIG. 24. The modification is the same as the first modification shown in FIG. 23 except that the resistor 156 whose one end is grounded is connected to the output end of the booster BC. The same reference numerals in FIG. 23 denote the same parts in FIG. 24.

In the semiconductor memory device with the above arrangement, the erase gate EG of each memory cell is set at the ground potential by the resistor 156 even if the output end of the booster BC is set in the floating condition when data is not erased. Therefore, the erase gate EG of each memory cell is not set in the floating condition, so that an erratic operation of the memory cell due to noise may be prevented. Furthermore, when data is not erased, the floating gate FG is biased to a potential close to the ground potential by coupling of the overlapped area between the floating gate FG and the erase gate EG since the erase gate EG is set at the ground potential. As a result, the threshold voltage $V_{TH}$ of the memory cell is made deep, that is high.

The third modification of the semiconductor memory device shown in FIG. 19 will be described with reference to FIG. 25. This modification is the same as the first modification shown in FIG. 23 except that the resistor 158 whose one end receives the power source voltage Vcc of, for example, +5V of positive polarity is connected to the output end of the booster BC. Therefore, the same reference numerals in FIG. 23 denote the same parts in FIG. 25. With the above arrangement, the erase gate EG of each memory cell is set at the Vcc potential by the resistor 158 even if the output end of the booster BC is set in the floating state when data is not erased, as shown in the second modification shown in FIG. 24. In this manner, the erase gate EG is not placed under the floating gate and an erratic operation of the memory cell due to noise may be prevented.

Furthermore, when data is not erased, the floating gate FG is biased to a potential close to the power source voltage Vcc by coupling of the overlapping area between the floating gate FG and the erase gate EG, since the erase gate EG is set at the Vcc potential. Therefore, the threshold voltage of the memory cell becomes shallow, that is, low.

The fourth modification of the semiconductor memory device shown in FIG. 19 will be described with reference to FIG. 26. The fourth modification is the same as the first modification shown in FIG. 23 except that one end of the resistor 156 whose other end is grounded and one end of the resistor 158 whose other end receives the power source voltage Vcc of positive polarity of, for example, +5V are connected to the output end of the booster BC. The same reference numerals in FIG. 23 denote the same parts in FIG. 26. With such an arrangement, the erase gate EG is set at a predetermined potential between the ground potential and the power source voltage Vcc when the data is not erased.

Figure 24:
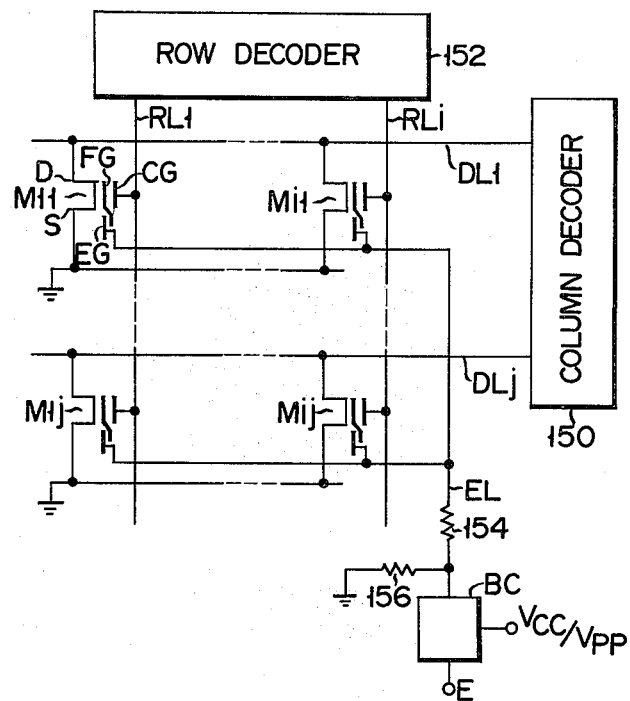
FIG. 24 is a circuit diagram of a second modification of the semiconductor memory device of FIG. 19.
Figure 25:
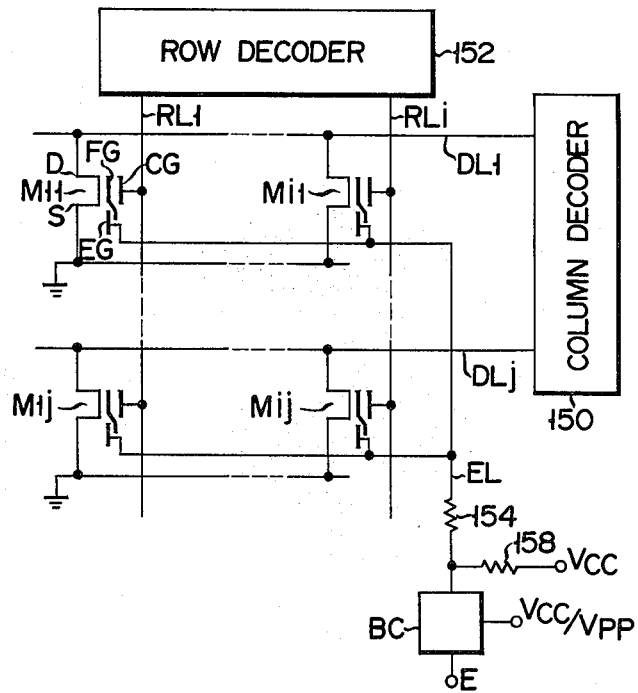
FIG. 25 is a circuit diagram of a third modification of the semiconductor memory device of FIG. 19.

In order to protect effectively the memory cell in the modifications shown in FIGS. 24 to 26, the resistance of the resistor 154 is preferably higher than that of the resistors 156 and 158. The resistances of all the resistors 154, 156 and 158 are preferably higher than 1 kΩ.

The booster BC is not limited to the arrangement in the embodiments. Other boosters may be utilized. Furthermore, the erase gates EG of the memory cells may be commonly connected in each row unit.

In the first or second embodiment of the semiconductor memory device, the threshold voltage of the transistor constituting the memory cell may change at a rate of $$\Delta V_{TH} = Q_F / C_{FC} \qquad \ldots (1)$$

where $C_{FC}$ is the capacitance between the floating gate FG and the control gate CG and assuming that a charge (electrons) $-Q_F$ is injected in the floating gate FG. Since the threshold voltage changes $\Delta V_{TH}$ as given by relation (1) above due to the charge $-Q_F$, data stored in the memory cell may be discriminated as "1" or "0".

The rate of change $\Delta V_{TH}$ of the threshold voltage when a voltage $V_E$ is applied to the erase gate EG through the erase terminal Er may be given by:

$$\Delta V_{TH} = (Q_F - C_{FE} \cdot V_E)/C_{FC} \quad \ldots (2)$$

where $C_{FE}$ is the capacitance between the floating gate FG and the erase gate EG.

From relation (2), the charge $-(Q_F - C_{FE} \cdot V_E)$ apparently stored in the floating gate may be increased or decreased by the voltage $V_E$ to be applied to the erase gate EG. Therefore, the charge injected to the floating gate FG may be quantitatively determined from the voltage applied to the erase gate EG. In this manner, $Q_F$ may be determined from relation (2) by measuring the voltage $V_E$ applied to the erase gate which is necessary for obtaining a certain rate of charge $\Delta V_{TH}$ of the threshold voltage.

A practical method for measuring the charge $Q_F$ may be as follows. A memory cell is selected by decoders 150 and 152. Then, the value of the voltage $V_E$ with which the data of the light line of the selected memory cell is inverted (i.e. the current flowing through the memory cell is inverted) is measured while, by means of a voltage changing device, changing the voltage $V_E$ applied to the erase terminal Er and the erase line EL. If the charge $Q_F$ of the memory cell immediately after writing of data is measured and the charge $Q_F$ of this memory cell is measured after a predetermined period of time has elapsed, the rate of attenuation of the charge over time may be determined from both of the measurements. Since the charge retention characteristics of the respective memory cells may thus be evaluated, bits of inferior charge retention characteristics of the memory cells may be screened out in advance.

For determining the charge $Q_F$ on the memory cell with efficiency, it is assumed that $C_{FE} \simeq C_{FC}$ in relation (2). However, it must be assumed that $C_{FC} > C_{FE}$ from the viewpoint of better writing efficiency. Therefore, it is preferable to satisfy the relation:

$$C_{FC} > C_{FE} \geq C_{FC}/5 \quad \ldots (3)$$

where $C_{FE}$ is the capacitance between the floating gate and the erase gate and $C_{FC}$ is a constant capacitance between the floating gate and the control gate in order to check the charge with efficiency while maintaining a good writing efficiency.

What is claimed is:

1. A semiconductor memory device comprising:
   a memory matrix in which a plurality of memory cells are arranged in a matrix form, each of said memory cells including:
   a semiconductor region of first conductivity type having an impurity region of second conductivity type,
   a first conductive layer formed on said semiconductor region with a first insulating film interposed therebetween,
   a second conductive layer which is formed on said semiconductor region with a second insulating film interposed therebetween and which has a function of storing data, a part of said second conductive layer overlapping said first conductive layer, and
   a third conductive layer which is formed on said second conductive layer with a third insulating film interposed therebetween and which is insulated from said first and second conductive layers;
   an erase line connected to said first conductive layer of each of said memory cells; and
   voltage supplying means for supplying a data erase voltage to said erase line to erase the data.

2. A semiconductor memory device according to claim 1, wherein a resistor circuit is arranged between said voltage supplying means and said erase line.

3. A semiconductor memory device according to claim 2, wherein said resistor circuit is a resistor element.

4. A semiconductor memory device according to claim 2, wherein
   said resistor circuit comprises
   a first resistor element arranged between said voltage supplying means and said erase line; and
   a second resistor element one end of which is connected to said voltage supplying means and the other end of which is grounded.

5. A semiconductor memory device according to claim 2, wherein
   said resistor circuit comprises
   a first resistor element arranged between said voltage supplying means and said erase line; and
   a second resistor element one end of which is connected to said voltage supplying means and the other end of which receives a power source voltage.

6. A semiconductor memory device according to claim 5, wherein said resistor circuit further comprises a third resistor element one end of which is connected to said voltage supplying means and the other end of which is grounded.

7. A semiconductor memory device according to claim 1, wherein said voltage supplying means is a booster which boosts a low voltage to supply the data erase voltage to said erase line when the data is erased.

8. A semiconductor memory device according to claim 7, wherein a resistor circuit is arranged between said booster and said erase line.

9. A semiconductor memory device according to claim 8, wherein said resistor circuit is a resistor element.

10. A semiconductor memory device according to claim 7, wherein
    said resistor circuit comprises
    a first resistor element arranged between said booster and said erase line; and
    a second resistor element one end of which is connected to said booster and the other end of which is grounded.

11. A semiconductor memory device according to claim 7, wherein
    said resistor circuit comprises
    a first resistor element arranged between said booster and said erase line; and
    a second resistor element one end of which is connected to booster and the other end of which receives the power source voltage.

12. A semiconductor memory device according to claim 11, wherein said resistor circuit further comprises a third resistor element one end of which is connected to said voltage supplying means and the other end of which is grounded.

13. A semiconductor memory device comprising: a memory cell including:
    a semiconductor region of first conductivity type having an impurity region of second conductivity type,
    a first conductive layer formed on said semiconductor region with a first insulating film interposed therebetween, a second conductive layer which is formed on said semiconductor region with a second insulating film interposed therebetween and which has a function of storing data, a part of said second conductive layer overlapping said first conductive layer, and a third conductive layer which is formed on said second conductive layer with a third insulating film interposed therebetween and which is insulated from said first and second conductive layers;

means for varying a voltage supplied to said first conductive layer of said memory cell; and means for measuring a current flowing through said memory cell.

14. A method for measuring charge on a memory cell comprising the steps of:

varying a voltage supplied to an erase gate of said memory cell;

inverting a current flowing through said memory cell; and measuring the change in voltage at said erase gate when said current is inverted.

15. A semiconductor memory device comprising; a memory matrix wfth a plurality of memory cells arranged in a matrix form, each of said memory cells including;

a semiconductor region of first conductivity type;

source and drain regions of second conductivity type formed in said semiconductor region, a gate insulation film formed on said semiconductor region between said source and drain regions, a field insulation film formed on said semiconductor region for separating said memory cells from each other, an erase gate formed on said field insulation film, a floating gate formed on said gate insulation film and extending in a direction of said erase gate to overlap a part of said erase gate with a first insulating film being interposed between said floating gate and said erase gate, and a control gate formed on said floating gate with a second insulating film being interposed between said control gate and said floating gate, said control gate being insulated from said erase gate and said floating gate, and said control gate overlapping the portion of said floating gate overlapping said erase gate;

an erase line connected to said erase gate of each of said memory cells; and voltage supplying means for supplying a data erase voltage to said erase line.

* * * * *